United States Patent [19]

Sugiyama

[11] Patent Number: 5,763,931
[45] Date of Patent: Jun. 9, 1998

[54] SEMICONDUCTOR DEVICE WITH SOI STRUCTURE AND FABRICATION METHOD THEREOF

[75] Inventor: Mitsuhiro Sugiyama, Tokyo, Japan

[73] Assignee: NEC Corporation, Tokyo, Japan

[21] Appl. No.: 531,913

[22] Filed: Sep. 21, 1995

[30] Foreign Application Priority Data

Sep. 22, 1994 [JP] Japan .................. 6-227650

[51] Int. Cl.$^6$ .................. H01L 21/265; H01L 33/00
[52] U.S. Cl. .................. 257/506; 257/347; 257/349; 257/353; 257/354; 257/397; 257/501; 257/513; 257/520; 438/149; 438/164; 438/203
[58] Field of Search .................. 257/347, 353, 257/354, 521, 506, 517, 520, 526, 349, 350, 351, 368, 369, 372, 374, 397, 398–399, 400, 513; 349/149, 164

[56] References Cited

U.S. PATENT DOCUMENTS

| | | | |
|---|---|---|---|
| 4,849,371 | 7/1989 | Hansen et al. | 437/234 |
| 5,356,822 | 10/1994 | Lin et al. | 438/203 |
| 5,371,401 | 12/1994 | Kurita | 257/524 |
| 5,530,266 | 6/1996 | Yonehara et al. | 247/347 |
| 5,541,429 | 7/1996 | Shibib | 257/327 |

FOREIGN PATENT DOCUMENTS 63-24672  2/1988  Japan .
3-4539    1/1991  Japan .

OTHER PUBLICATIONS

T. Uchino et al., "15–ps ECL/74–GHz fT Si Bipolar Technology", IEEE, 1993, pp. 67–70.

Primary Examiner—Tom Thomas
Assistant Examiner—Fetsum Abraham
Attorney, Agent, or Firm—Young & Thompson

[57] ABSTRACT

A semiconductor device having the SOI structure is provided, which enables to reduce the size of components compared with the conventional semiconductor devices. The device contains a first insulator film formed on a semiconductor substrate, and semiconductor islands formed on the first insulator film. Each of the islands has an electronic component. The device further contains semiconductor sidewalls formed to surround the respective islands. The sidewalls are contacted with outer sides of the corresponding islands. Electrodes are formed outside the islands to be contacted with the corresponding sidewalls. A second insulator film is formed on the exposed first insulator film from the islands to laterally isolate the respective islands and the corresponding sidewalls from each other. The electronic components are electrically connected to the respective electrodes through the corresponding sidewalls. Preferably, the components provided in the islands are bipolar transistors, and the electrodes are used as collector electrodes.

14 Claims, 6 Drawing Sheets 5,763,931

1

SEMICONDUCTOR DEVICE WITH SOI STRUCTURE AND FABRICATION METHOD THEREOF

BACKGROUND OF THE INVENTION

1. Field of the Invention

The present invention relates to a semiconductor device and more particularly, to a semiconductor device with the Silicon-On-Insulator (SOI) structure and a fabrication method thereof.

2. Description of the Prior Art

With a conventional semiconductor device containing bipolar transistors that are integrated or miniaturized on a semiconductor substrate and are capable of high-speed operation, the bipolar transistors have been usually fabricated by using the self-alignment and trench isolation techniques.

FIG. 1 shows a partial cross-section of a conventional semiconductor device containing npn bipolar transistors of this sort, in which only one of the transistors is represented for the sake of simplification of description.

In FIG. 1, an $n^+$-silicon layer 32 is formed on a p-silicon substrate 31 and an $n^-$-silicon epitaxial layer 35 is formed on the layer 32. A patterned silicon dioxide ($SiO_2$) film 38 is formed on the epitaxial layer 35. A patterned $SiO_2$ film 39 is formed on the film 38 and the exposed area of the epitaxial layer 35.

An isolation region 33, which is made of an oxide filled in a narrow and deep groove, defines an active region and laterally isolates the active region from the other components on the substrate 31. The isolation region 33 vertically extends from the surface of the epitaxial layer 35 to the inside of the substrate 31. Thus, this transistor has the trench isolation structure.

In the active region, a base region 36 and an emitter region 37 are formed in the epitaxial layer 35. The $n+$-silicon layer 32 acts as a buried layer. An $n^+$-collector connection region 34 is formed in the epitaxial layer 35. The connection region 34 is laterally apart from the base region 36 and, is contacted with the isolation region 33 and with the $n^+$-silicon buried layer 32. The epitaxial layer 35 other than the base and emitter regions 36 and 37 acts as a collector region 35a.

A polysilicon collector electrode 40 and a polysilicon base electrode 41 are formed on the SiO2 film 38 to be contacted with the collector connection region 34 and the base region 36 through collector and base windows of the film 38, respectively. A polysilicon emitter electrode 42 is formed on the SiO2 film 39 to be contacted with the emitter region 37 through an emitter window of the film 39. The collector region 35a is electrically connected to the collector electrode 40 through the buried layer 32 and the collector connection region 34.

Usually, the collector connection region 34 is formed through a step (i) of selectively doping an n-impurity into the epitaxial layer 35 by an ion-implantation or vapor phase diffusion process using a masking insulator or resist film and a step (ii) of diffusing the doped impurity within the layer 35 by a heat treatment process so that the connection region 34 is contacted with the buried layer 32. During the diffusing or heat treatment process (ii), the doped impurity diffuses not only vertically but also laterally. Therefore, the lateral distance between the opposing ends of the connection region 34 and the base region 36 is designed to be long enough so that the regions 34 and 36 are ensured to be electrically separated from each other in spite of the lateral diffusion.

2

Unless the lateral distance is long enough, the following problems tend to occur. First, an obtainable base-collector breakdown voltage does not become satisfactorily high, which prevents the normal operation of the transistor. Second, crystal defects occurred in the collector connection region 34 sometimes reach the base region 36 to cause a leakage current during the operation of the transistor. This results in remarkably low fabrication yield of the transistor.

With the conventional semiconductor device of FIG. 1, the base and emitter regions 36 and 37 are formed by using the self-alignment technique to miniaturize the regions 36 and 37. However, the collector region 35a cannot be reduced in size still more due to the long lateral distance between the collector connection region 34 and the base region 36. In other words, the transistor cannot be miniaturized still more due to the size of the collector region 35a.

Accordingly, it is difficult to reduce the parasitic capacitance between the n+-buried layer 34 and the p-substrate 31, i.e., the collector-substrate capacitance, and the collector resistance.

To reduce the collector-substrate capacitance, recently, the SOI structure has been often employed. FIG. 2 shows a partial cross-section of another conventional semiconductor device containing npn bipolar transistors of the sort. The transistors also have the trench isolation structure.

The bipolar transistor of FIG. 2 has the same structure as that of the transistor of FIG. 1 except for the SOI structure. Specifically, the SOI structure is made of a silicon supporting substrate 43, an $n^+$-silicon substrate or layer 45 and an $SiO_2$ film 44 formed between the substrate 43 and the layer 45. The $n^-$-silicon epitaxial layer 35 is formed on the $n^+$-silicon layer 45. An isolation region 33a, which is made of an oxide filled in a narrow and deep groove, defines an active region and laterally isolates the active region from the other components. The n+-silicon layer 45 acts as the buried layer 32 in the active region. Unlike the transistor of FIG. 1, the isolation region 33a vertically extends from the surface of the epitaxial layer 35 to the $SiO_2$ film 44.

The transistor of FIG. 2 is fabricated by the same process sequence as that of FIG. 1 except that the substrate 31 and the buried layer 32 are replaced by the SOI structure made of the supporting substrate 43, the $SiO_2$ film 44 and the silicon layer 45.

Although the collector-substrate capacitance is due to the p-n junction between the $n^+$-buried layer and the p-substrate 31 in the transistor of FIG. 1, it is due to the $SiO_2$ film 44 between the substrate 43 and the silicon layer 45 in the transistor of FIG. 2. Therefore, the thicker the $SiO_2$ film 44, the lower the collector-substrate capacitance.

For example, with a typical high-speed bipolar transistor having the structure of FIG. 2, the collector-substrate capacitance decreases to about (½) to (⅓) times as high as that of the transistor of FIG. 1 when the $SiO_2$ film 44 is about 0.5 µm in thickness.

However, with the semiconductor device of FIG. 2, the area of the collector region 35a is the same as that of the device of FIG. 1 and therefore, the collector resistance cannot be reduced. Also, to decrease the collector-substrate capacitance still more, the area of the collector region 35a itself needs to be reduced, which is not easy to be realized for the structure of FIG. 2.

Then, to reduce the area of the collector region 35a, a conventional semiconductor device shown in FIG. 3 was developed, which was disclosed in the Japanese Non-Examined-Patent Publication No. 3-4539 published in January 1991. This device has a collector connection region formed to be closer to a base region for collector area reduction.

In FIG. 3, a p-silicon substrate 51 is selectively etched to produce a groove G defining an active region. An n+-buried layer 52 is formed at a bottom of the groove G. A first $SiO_2$ film 63 is formed on the inner, vertical side of the groove G to isolate the active region. A collector connection region 60, which is made of an n-polysilicon film, is formed on the buried layer 52 along the first $SiO_2$ film 63. The connection region 60 is contacted with the first $SiO_2$ film 63. A second $SiO_2$ film 64 is formed on the inner, vertical side face of the polysilicon collector connection region 60. The first and second $SiO_2$ films 63 and 64 and the connection region 60 extend to the surface of the substrate 51.

A collector region 55, which is made of an n−-silicon epitaxial layer, is formed on the buried layer 52 to be surround by the $SiO_2$ film 64. A base region 56, which is made of a p-diffusion region, is formed on the collector region 55 to be surrounded by the $SiO_2$ film. 64. An emitter region 57, which is made of an n-diffusion region, is formed on the base region 56 to be buried therein.

A base connection region 61, which is made of, a p-polysilicon film, is formed on the base region 56 to be contacted therewith. The region 61 is surrounded by the second $SiO_2$ film 64. A third $SiO_2$ film 65 is formed on the inner, vertical side face of the polysilicon base connection region 61. An emitter connection region 62, which is made of an n-polysilicon film, is formed on the emitter region 57 to be contacted therewith. The region 62 is surrounded by the third $SiO_2$ film 65.

A fourth $SiO_2$ film 59 is formed on the substrate 51 to cover the active region. A metal emitter electrode 66 is formed to be contacted with the emitter connection region 62 through an emitter window of the film 59. A metal bate electrode 67 is formed to be contacted with the base connection region 61 through a base window of the film 59. A metal collector electrode 68 is formed to be contacted with the collector connection region 60 through a collector window of the film 59.

Thus, the bipolar transistor is isolated by the first $SiO_2$ film 63 from the other components on the substrate 51. The collector and base regions 55 and 56 and the base connection region 61 are isolated by the second $SiO_2$ film 64 from the collector connection region 60. The emitter connection region 62 is isolated by the third $SiO_2$ film 65 from the base connection region 61.

The collector, base and emitter connection regions 60, 61 and 62 are formed in self-alignment in the groove G, respectively, miniaturizing the bipolar transistor. The collector connection region 60 is directly connected to the buried layer 52 provided at the bottom of the groove G.

With the conventional semiconductor device of FIG. 3, the spacing between the base region 56 and the collector connection region 60 can be very short. As a result, the area of the collector region 55 can be smaller than the cases of the conventional semiconductor devices of FIGS. 1 and 2.

However, as the spacing between the regions 56 and 60 decreases, the spacing between the metal collector and base electrodes 66 and 67 and that between the metal base and emitter electrodes 67 and 66 become shorter. For this reason, the area reduction of the collector region 55 is restricted by the minimum limit of the technique for forming the metal electrodes 66, 67 and 68. Consequently, intended area reduction of the collector region 55 is difficult to be realized. Also, the fabrication process sequence is very complex.

To reduce the area of the collector region, a conventional semiconductor device shown in FIG. 4 was developed, which was disclosed in the Japanese Non-Examined-Patent Publication No. 63-24672 published in February 1988.

In FIG. 4, an n+-silicon buried layer 72 is formed on a p-silicon substrate 71. An n−-silicon epitaxial layer 75 is grown on the layer 72 and the exposed area of the substrate 71. A patterned $SiO_2$ film 79 is formed on the epitaxial layer 75.

A first groove G1 for isolation purpose is formed in the epitaxial layer 75 to surround the buried layer 72, defining an active region. The first groove G1 vertically extends from the surface of the epitaxial layer 75 to the inside of the substrate 71. An $SiO_2$ film 78a is formed on the outer and inner sides and bottom of the first groove G1. An n+-polysilicon 73 is deposited on the $SiO_2$ film 78a in the first groove G1. Thus, the first groove G1 is filled with the $SiO_2$ film 78a and the n+-polysilicon 73, acting as an isolation region.

In the active region, a second groove G2 for collector connection purpose is formed in the epitaxial layer 75 over the buried layer 72. The second groove G2 vertically extends from the surface of the epitaxial layer 75 to the surface of the buried layer 72. An $SiO_2$ film 78b is formed on the outer and inner sides and bottom of the second groove G2. An n-polysilicon 80 is formed on the $SiO_2$ film 78b in the second groove G2. Thus, the second groove G2 is filled with the $SiO_2$ film 78b and the n+-polysilicon 80.

In the active region, a base region 76 and an emitter region 77 is formed in the epitaxial layer 75 over the buried layer 72. The epitaxial layer 75 other than the base and emitter regions 76 and 77 acts as a collector region 75a. The bottom of the polysilicon 80 buried in the second groove G2 is contacted with the buried layer 72. The polysilicon 80 acts as a collector connection region.

A collector electrode 81, a base electrode 82 and an emitter electrode 83 are formed on the SiO2 film 79. These electrodes 81, 82 and 83 are contacted with the collector connection region 80, the base region 76 and the emitter region 77 through collector, base and emitter windows of the film 79, respectively.

With the conventional semiconductor device of FIG. 4, since the second groove G2 that is shallower than the first groove G1 is necessary to be formed, the number of the fabrication processes increases. Also, because a useless area exists between the isolation region (i.e., the first groove G1) and the collector connection region 80 (i.e., the second groove G2), the area of the collector region 75a is not satisfactorily reduced.

SUMMARY OF THE INVENTION

Accordingly, an object of the present invention is to provide a semiconductor device that enables to reduce the size of components compared with the conventional semiconductor devices, and a fabrication method of the device.

Another object of the present invention is to provide a semiconductor device that can be more simply fabricated than the cases of the conventional semiconductor devices and a fabrication method of the device.

Still another object of the present invention is to provide a semiconductor device having bipolar transistors that enables to decrease the collector area, the collector resistance and the collector-substrate capacitance compared with the conventional semiconductor devices, and a fabrication method of the device.

According to a first aspect of the present invention, a semiconductor device is provided. This device contains a first insulator film formed on a semiconductor substrate; semiconductor islands formed on the first insulator film, each of the islands having an electronic component and being vertically isolated by the first insulator film; semiconductor sidewalls formed to surround the respective islands, the sidewalls being contacted with outer sides of the corresponding islands; electrodes formed outside the islands to be contacted with the corresponding sidewalls; and a second insulator film formed on the exposed first insulator film from the islands to laterally isolate the respective islands and the corresponding sidewalls from each other. The electronic components are electrically connected to the respective electrodes through the corresponding sidewalls.

With the semiconductor device according to the first aspect of the present invention, the semiconductor sidewalls are formed outside the islands to surround the corresponding islands, and the electrodes also are formed outside the islands to be electrically connected to the components in the corresponding islands through the corresponding sidewalls. Therefore, the components can be reduced in size compared with the conventional semiconductor devices.

Also, the semiconductor device is fabricated by forming the islands on the first insulator film, forming the sidewalls to surround the corresponding islands, and forming the electrodes to be contacted with the corresponding sidewalls. Consequently, the semiconductor device can be more simply fabricated than the cases of the conventional semiconductor devices.

In a preferred embodiment, each of the semiconductor sidewalls is made of a polycrystalline semiconductor doped with arsenic (As). In this case, since arsenic has a relatively small diffusion coefficient, no problem occurs due to the lateral diffusion of the arsenic from the connection regions toward the centers of the corresponding islands.

In another preferred embodiment, the components provided in the islands are bipolar transistors, and the electrodes are used as collector electrodes. In this case, because the semiconductor sidewalls and the collector electrodes are formed outside the islands, and the collector electrodes are electrically connected to the respective transistors through the corresponding sidewalls, the collector area can be reduced.

Since the sidewalls are formed to surround the corresponding islands and are contacted with outer sides of the corresponding islands, the collector resistance can be reduced.

Because the collector area is reduced and the islands are formed on the first insulator film, the collector-substrate capacitance can be smaller than the cases of the conventional semiconductor devices.

According to a second aspect of the present invention, a fabrication method of the semiconductor device according to the first aspect is provided. The method contains the following steps.

A semiconductor substructure is first prepared. The substructure is made of a semiconductor substrate, a first insulator film formed on the substrate, and a first semiconductor layer formed on the first insulator film. Next, an impurity of one conductivity type is doped into the first semiconductor layer of the substructure, and then a second semiconductor layer of the conductivity type is epitaxially grown on the first semiconductor layer. The first and second semiconductor layers are selectively removed to produce semiconductor islands on the first insulator film. The islands are vertically isolated by the first insulator film.

Semiconductor sidewalls are formed to surround the respective islands. The sidewalls are contacted with outer sides of the corresponding islands. A second insulator film is formed on the exposed first insulator film from the islands to laterally isolate the respective islands and the corresponding sidewalls from each other. Electrodes are formed outside the islands to be contacted with the corresponding sidewalls. Electronic components are formed in the respective islands. The electronic components are electrically connected to the respective electrodes through the corresponding sidewalls.

With the fabrication method according to the second aspect, the semiconductor device according to the first aspect is obtained. Also, since the method contains the steps of forming the islands on the first insulator film, forming the sidewalls to surround the corresponding islands, and forming the electrodes to be contacted with the corresponding sidewalls, the semiconductor device can be fabricated more simply than the cases of the conventional semiconductor devices.

In a preferred embodiment, the semiconductor sidewalls are made of a polycrystalline semiconductor doped with As. In this case, no problem due to the lateral diffusion of the arsenic from the connection regions toward the centers of the corresponding islands occurs because of the relatively small diffusion coefficient of As.

In another preferred embodiment, the components provided in the islands are bipolar transistors, and the electrodes are used as collector electrodes. In this case, the semiconductor device having bipolar transistors whose collector area, collector resistance and collector-substrate capacitance are lower than the cases of the conventional semiconductor devices can be obtained.

DETAILED DESCRIPTION OF THE PREFERRED EMBODIMENTS

Figure 1:
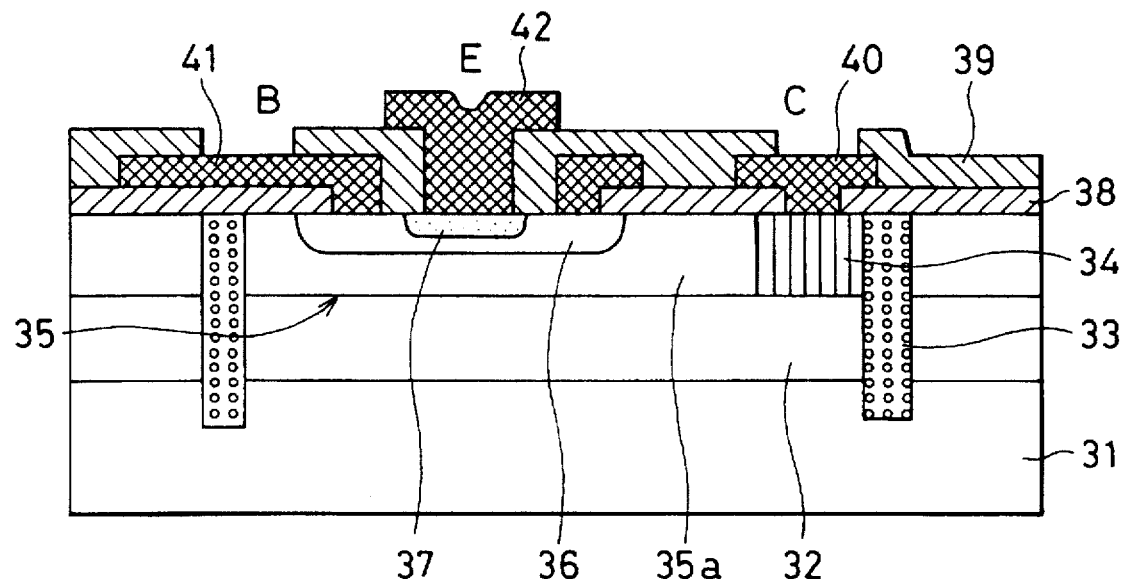
FIG. 1 shows a partial cross-section of a conventional semiconductor device containing npn bipolar transistors.
Figure 2:
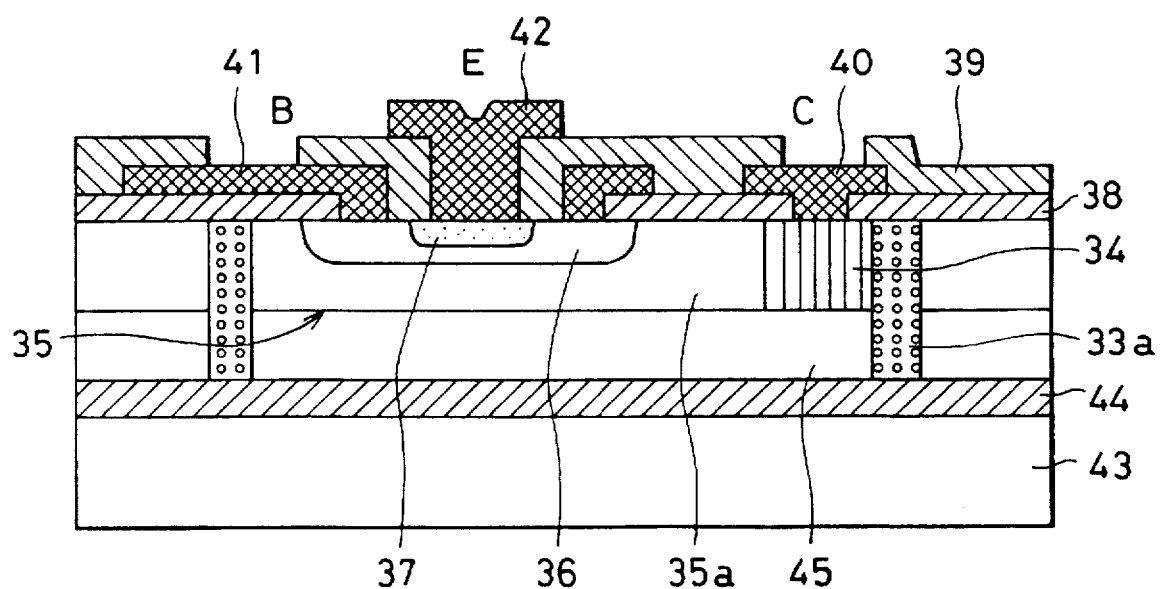
FIG. 2 shows a partial cross-section of another conventional semiconductor device containing npn bipolar transistors.
Figure 3:
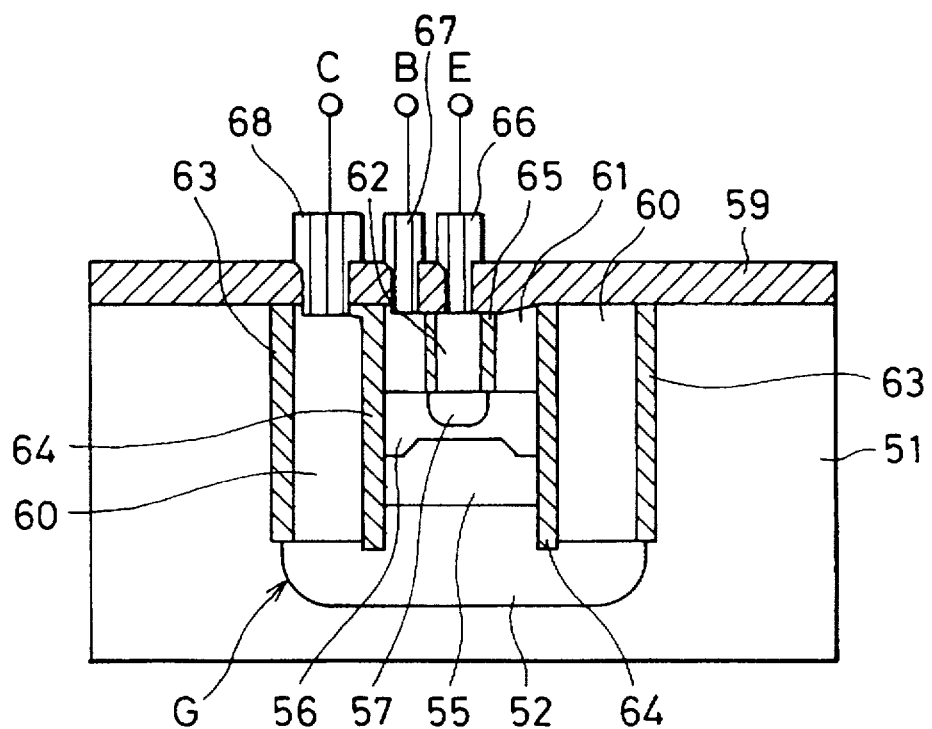
FIG. 3 shows a partial cross-section of still another conventional semiconductor device containing npn bipolar transistors.
Figure 4:
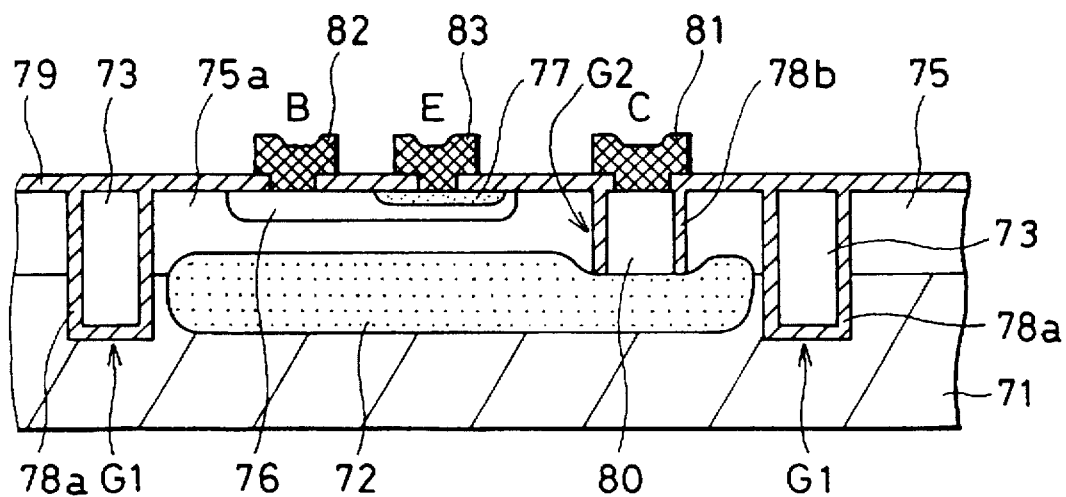
FIG. 4 shows a partial cross-section of a further conventional semiconductor device containing npn bipolar transistors.

Preferred embodiments of the present invention will be described below while referring to the drawings attached.

First Embodiment

Figure 5:
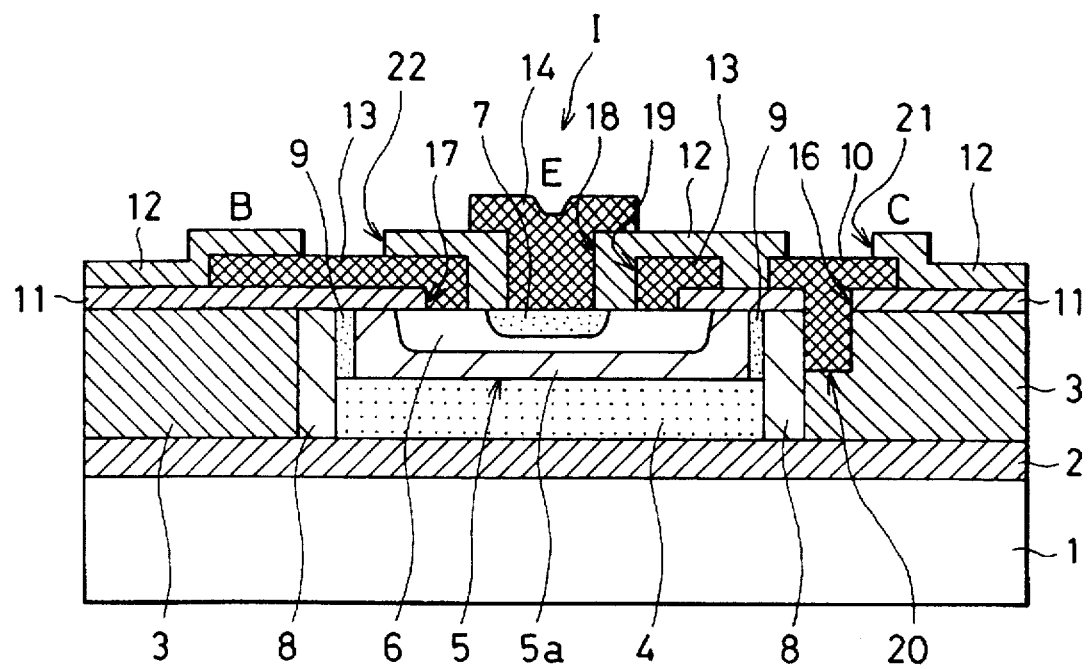
FIG. 5 shows a partial cross-section of a semiconductor device containing npn bipolar transistors according to a first embodiment of the present invention.
Figure 6:
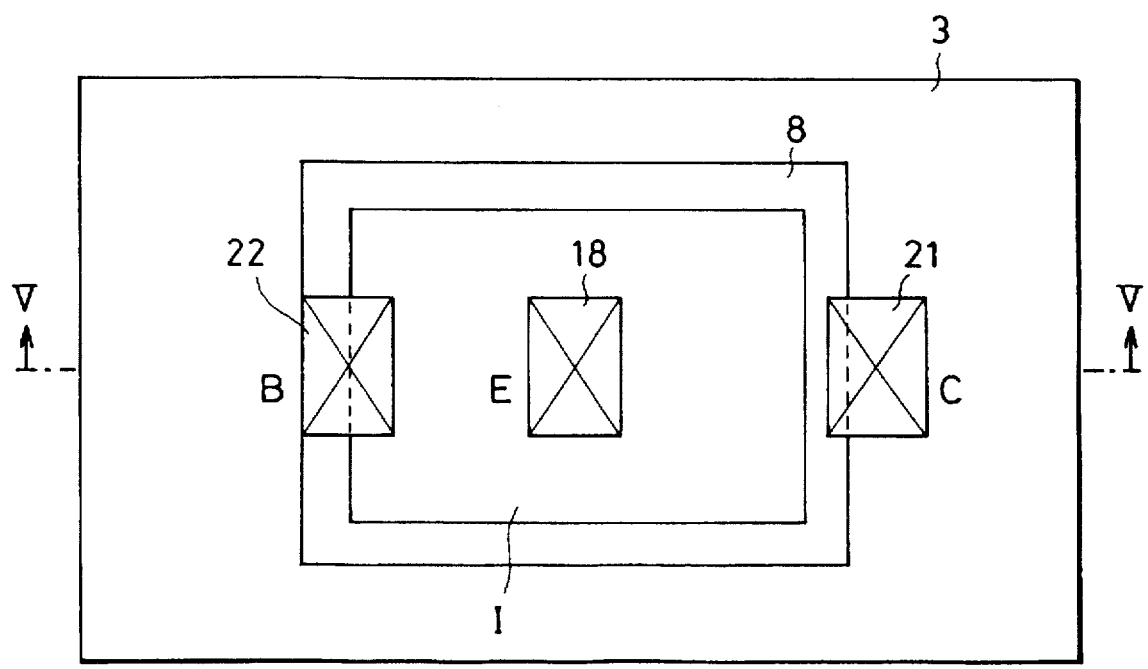
FIG. 6 schematically shows a partial plan view of the semiconductor device of FIG. 5.

A semiconductor device having npn bipolar transistors according to a first embodiment of the invention is shown in FIGS. 5 and 6, in which only one of the transistors is represented for the sake of simplification of description.

In FIG. 5, a first $SiO_2$ film 2 is formed on a silicon supporting substrate 1, and single-crystal silicon islands I having each a rectangular plan shape are formed on the film 2. The islands 1 each has a bipolar transistor and is vertically isolated by the film 2. Thus, the semiconductor device has the SOI structure.

Since all the islands I have the same structure, only one of the islands I is described in detail here for simplicity.

The island I is mainly made of an n+-single-crystal silicon layer 4 formed on the first $SiO_2$ film 2, and an $n^-$-single-crystal silicon epitaxial layer 5 formed on the layer 4. The silicon layer 4 acts as a collector buried layer of the transistor. An n-collector region 5a, a p-base region 6 and an n-emitter region 7 of the transistor are formed in the silicon epitaxial layer 5 in the island. Additionally, an $n^+$-diffusion region 9 is formed on the layer 4 to extend along the inner side of the sidewall 8. The region 9 is contacted with the inner side of the sidewall 8 and the outer side of the collector region 5a.

A sidewall 8 made of an arsenic-doped polysilicon film is formed on the first $SiO_2$ film 2 to surround the island I. The sidewall 8 is contacted with the outer side of the buried layer 4 and that of the diffusion region 9. The sidewall 8 vertically extends from the surface of the island I or the epitaxial layer 5 to the first $SiO_2$ film 2. The doping concentration of the sidewall 8 is typically $1 \times 10$ atoms/cm$^{-3}$.

A second $SiO_2$ film 3 is formed on the exposed first $SiO_2$ film 2 from the islands I to bury the space between the adjacent islands. The islands I and the corresponding sidewalls 8 are laterally isolated by the second $SiO_2$ film 3 from each other.

A third $SiO_2$ film 11 having base windows 17 and collector windows 16 is formed over the entire substrate 1, covering the islands I, the sidewalls 8 and the second $SiO_2$ film 3. Each of the base windows 17 is located right over the corresponding base region 6, exposing almost all the corresponding base region 6 therefrom. Each of the collector windows 16 is located outside the corresponding silicon island I to be adjacent to the corresponding polysilicon sidewall 8. Holes 20 are formed in the second $SiO_2$ film 3 right below the respective collector windows 16. The outer sides of the sidewalls 8 are exposed within the respective holes 20.

Collector electrodes 10 are formed on the third $SiO_2$ film 11 to fill the respective holes 20 through the corresponding collector windows 16 of the $SiO_2$ film 11. The collector electrodes 10 are contacted with and electrically connected to the corresponding sidewalls 8.

Base electrodes 13 are formed on the third $SiO_2$ film 11 to be contacted with the respective base regions 6 through the corresponding base windows 17 of the $SiO_2$ film 11. The base electrodes 13 are electrically connected to the corresponding base regions 6.

A fourth $SiO_2$ film 12 having emitter windows 18 is formed on the third $SiO_2$ film 11 over the entire substrate 1. The film 12 is partially contacted with the surfaces of the respective islands I through the corresponding base windows 17 of the third $SiO_2$ film 11 around the corresponding emitter windows 18.

Each of the emitter windows 18 is located right over the corresponding emitter region 7, exposing almost all the corresponding emitter region 7 therefrom.

Emitter electrodes 14 are formed on the fourth $SiO_2$ film 12 to be contacted with and electrically connected to the corresponding emitter regions 7 through the corresponding emitter windows 18 of the fourth $SiO_2$ film 12.

Collector contact holes 21 are formed in the fourth $SiO_2$ film 12 to expose the respective collector electrodes 10 from the film 12. Base contact holes 22 are further formed in the fourth $SiO_2$ film 12 to expose the respective base electrodes 13 from the film 12. The emitter electrodes 14 are exposed from the film 12 through the emitter window 18.

The buried layers 4 in the islands I are electrically connected to the respective collector electrodes 10 through the corresponding polysilicon sidewalls 8. The buried layers 4 also in the islands I are electrically connected to the respective collector electrodes 10 through the corresponding sidewalls 8 and diffusion regions 9.

With the semiconductor device according to the embodiment, the polysilicon sidewalls 8 are formed outside the islands I to surround the corresponding islands I, and the collector electrodes 10 also are formed outside the islands I to be electrically connected to the buried layer 4 in the respective islands I through the corresponding sidewalls 8. Therefore, the collector area of each transistor can be reduced, resulting in size reduction of the transistor itself, compared with the conventional semiconductor devices shown in FIGS. 1 to 4.

Also, since the sidewalls are formed to surround the corresponding islands I and are contact with outer sides of the corresponding islands I, the collector resistance can be reduced compared with the conventional semiconductor devices shown in FIGS. 1 to 4.

Further, because the collector area is reduced and the islands I are formed on the first $SiO_2$ film 2, the collector-substrate capacitance can be smaller than the cases of the conventional semiconductor devices.

Concretely, for example, for the typical high-speed bipolar transistor, the collector area and the collector-substrate capacitance are respectively reduced by about 30 to 40% and the corrector resistance is reduced by about 20% compared with the conventional semiconductor devices.

The semiconductor device described above is fabricated by tho following process steps.

Figure 7A:
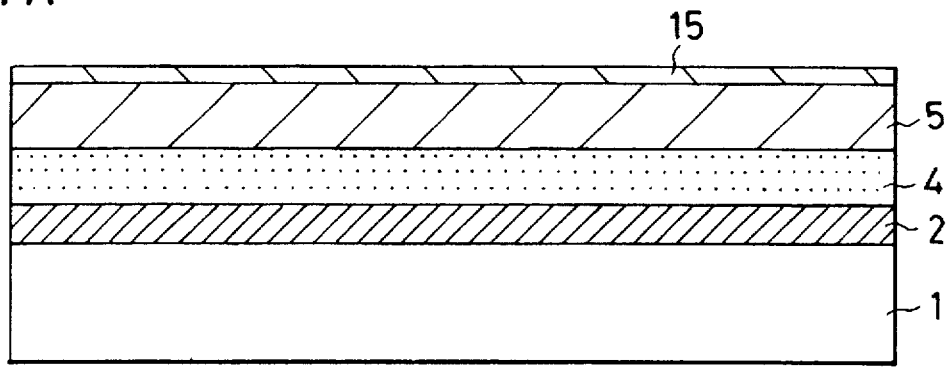
FIGS. 7A to 7I show partial cross-sections of the semiconductor device of FIG. 5 for explaining its fabrication process sequence, respectively.

First, as shown in FIG. 7A, a semiconductor substructure having the SOI structure is prepared. The substructure is made of the silicon substrate 1, the first $SiO_2$ film 2 formed on the substrate 1, and a single-crystal silicon layer formed on the film 2. The $SiO_2$ film 2 has a thickness of about 0.5 micron. The silicon layer has a thickness of about 1.5 micron.

For the substructure, conventional bonded wafers or substrates may be preferably used. The bonded wafers are usually produced by (i) preparing a silicon supporting wafer and a silicon wafer whose surface is oxidized, (ii) bonding the supporting wafer to the surface-oxidized wafer at the oxidized surface, and (iii) polishing the surface-oxidized wafer to be left a silicon active layer. The islands I are formed by using the active layer.

Next, arsenic as an n-impurity is heavily doped into the silicon layer of the substructure by a diffusion process, forming the $n^+$-silicon layer 4. The $n^-$-single-crystal silicon layer 5 is epitaxially grown up to about 1 µm in thickness on the silicon layer 4. A silicon nitride ($Si_3N_4$) film 15 having a thickness of about 200 nm is then deposited on the silicon layer 5 by a Chemical Vapor Deposition (CVD) process. The state at this stage is shown in FIG. 7A.

Figure 7B:
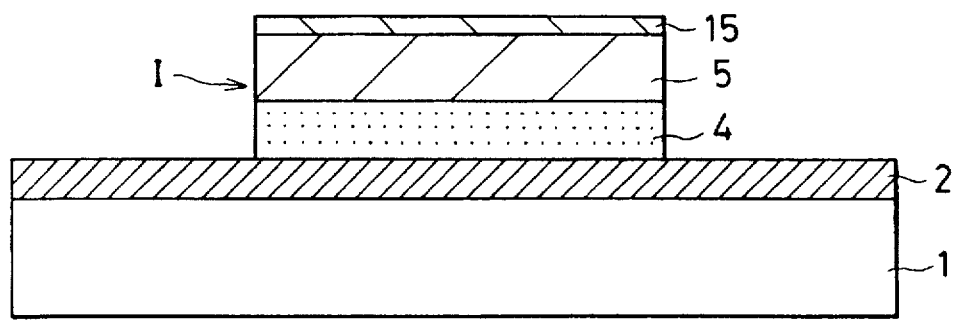

The silicon layers 4 and 5 and the $Si_3N_4$ film 15 are selectively etched using a masking resist film (not shown) to produce the silicon islands I on the $SiO_2$ film 2, as shown in FIG. 7B. The islands I are vertically isolated by the film 2. The masking resist film is then removed.

Figure 7C:
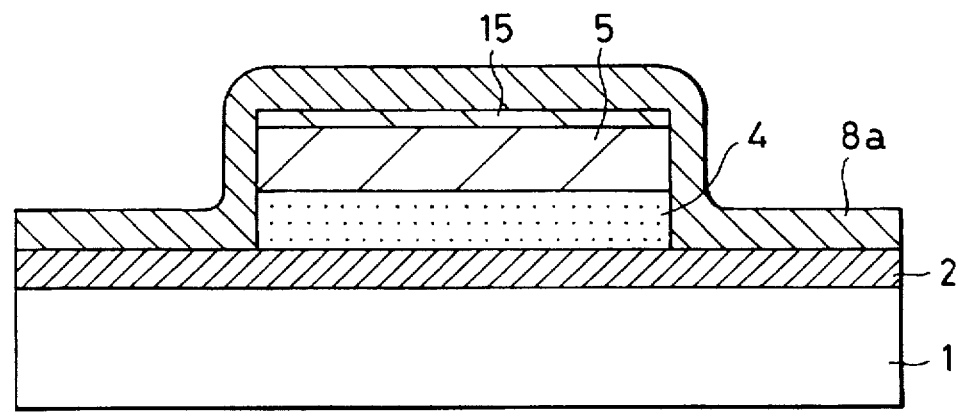
Figure 7D:
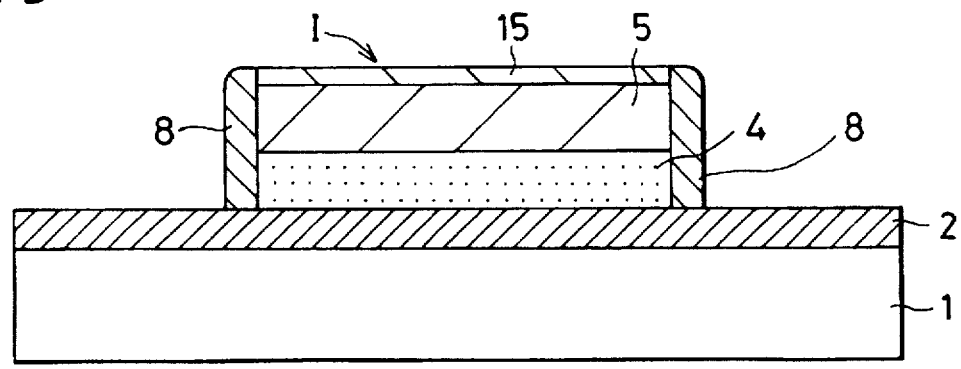

An $n^+$-polysilicon film 8a heavily doped with As is deposited on the islands I and the exposed $SiO_2$ film 2 over the entire substrate 1, as shown in FIG. 7C. The film 8a has a thickness of about 500 nm. The film 8a is selectively etched by an anisotropic dry etching process to be left on the outer vertical sides of the islands I alone, producing the polysilicon sidewalls 8, as shown in FIG. 7D. The $Si_3N_4$ film 15 is exposed from the film 8a through this process. The sidewalls 8 surround the respective islands I, and are contacted with the outer sides of the corresponding islands I.

The above dry etching process is performed by using a fluorine-system gas such as silicon fluoride ($SF_6$) or chlorine-system gas such as chlorine ($Cl_2$) under a pressure of about 10 Pa.

Figure 7E:
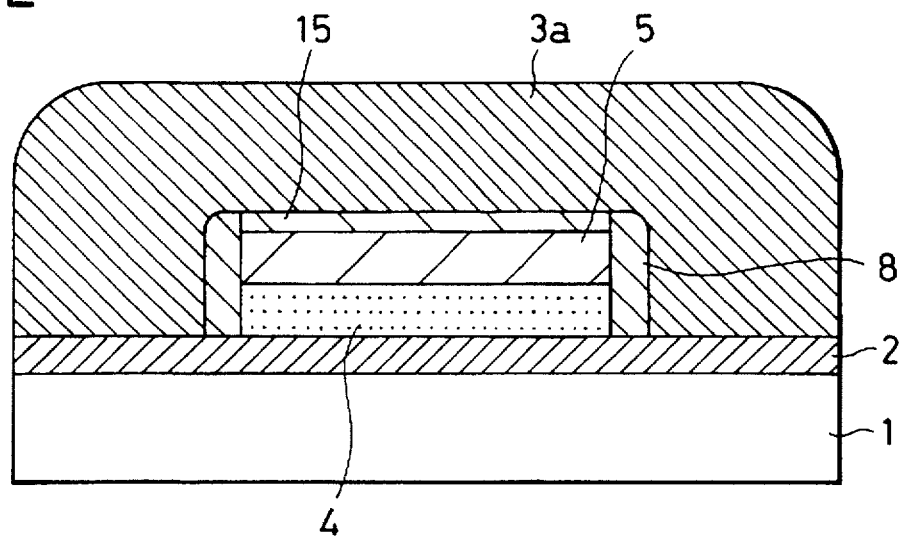
Figure 7F:
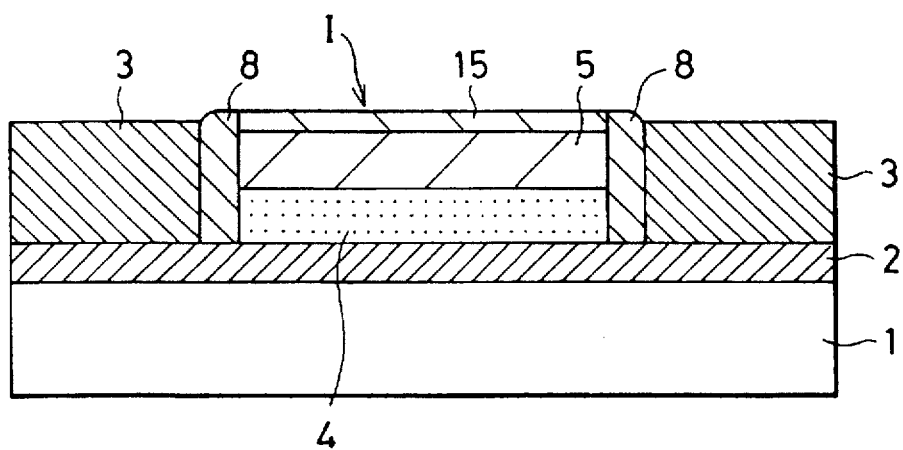

A thick $SiO_2$ film 3a is deposited over the entire substrate 1 to cover the islands I, the sidewalls 8 and the exposed first $SiO_2$ film 2, as shown in FIG. 7E. The film 3a is selectively removed by a polishing process until the $Si_3N_4$ film 15 remaining on the tops of the islands I are exposed, leaving the film 3a on the exposed $SiO_2$ film 2 alone. Thus, the second $SiO_2$ film 3 is selectively produced on the film 2 to bury the spacing between the adjacent islands I, as shown in FIG. 7F. The respective islands I and the corresponding sidewalls 8 are laterally isolated by the film 3 from each other.

During the polishing process, the polishing rate of the $Si_3N_4$ film 15 can be lower than that of the $SiO_2$ film 3a if the polishing conditions are suitably selected. In other words, the $Si_3N_4$ film 15 can be used as a polishing stop during this process.

Figure 7G:
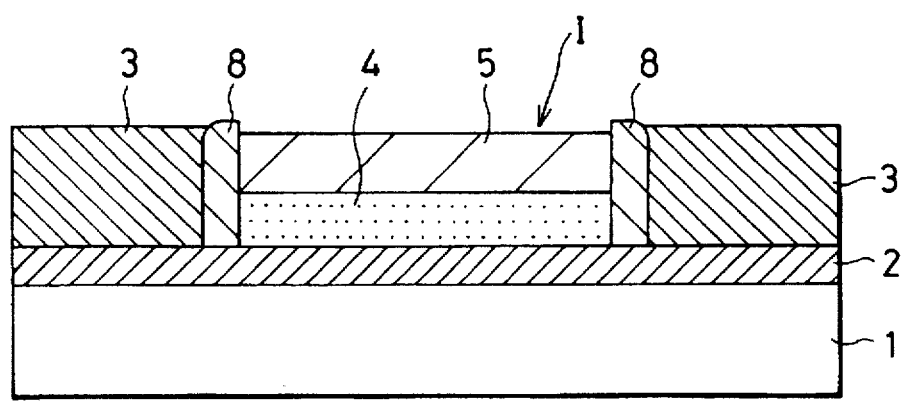

The $Si_3N_4$ film 15 remaining on the islands I is then removed by a wet etching process using phosphoric acid. The state at this stage is shown in FIG. 7G.

Figure 7H:
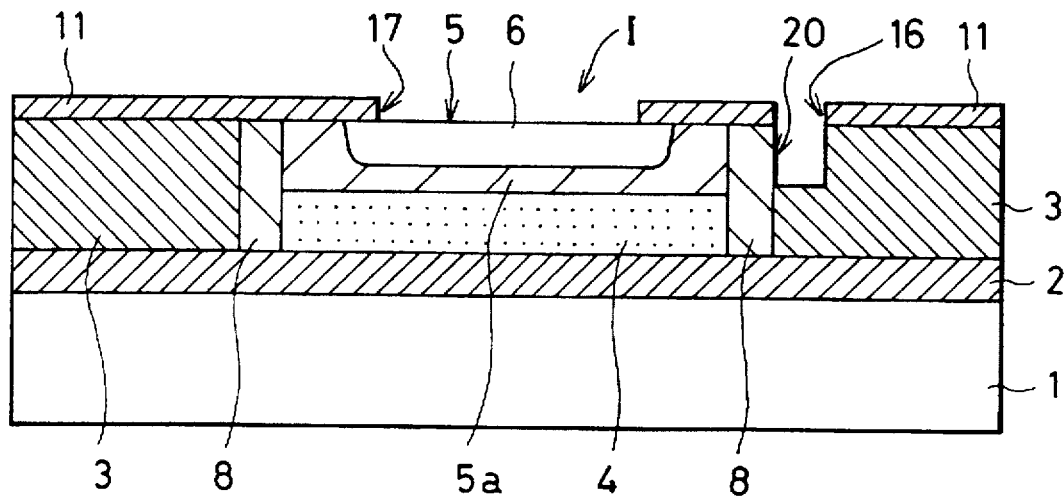

Subsequently, boron as a p-impurity is selectively ion-implanted into the $n^-$-silicon epitaxial layer 5 using a masking film (not shown), producing the base region 6, as shown in FIG. 7H. The unimplanted part of the layer 5 acts as the collector region 5a. The masking film is then removed.

The third $SiO_2$ film 11 is deposited over the entire substrate 1 to cover the islands I, the polysilicon sidewalls 8 and the second $SiO_2$ film 3. The film 11 is then etched selectively, forming the collector windows 16 and the base windows 17 in the film 11. As shown in FIG. 7H, the collector windows 16 are located outside the islands I to be adjacent to the respective polysilicon sidewalls 8. The base windows 16 are located right over the respective base regions 6.

The second $SiO_2$ film 3 is selectively etched by a dry etching process using a masking film (not shown) to produce the holes 20 at the positions right below the respective collector windows 16, as shown in FIG. 7H.

Figure 7I:
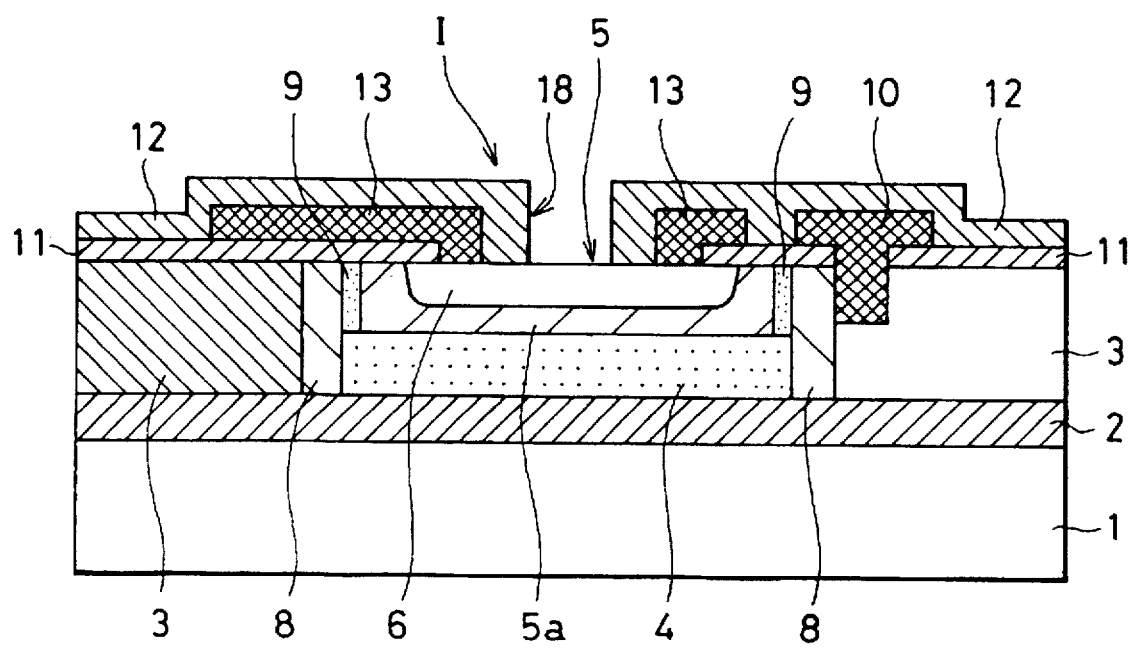

A polysilicon film is deposited on the third $SiO_2$ film 11 and the exposed islands I over the entire substrate 1 by a CVD process to be selectively etched, forming the collector electrodes 10 and the base electrodes 13. As shown in FIG. 7I, the polysilicon collector electrodes 10 are formed outside the islands I to fill the holes 20 and are contacted with the respective polysilicon sidewalls 8 through the corresponding collector windows 16 of the $SiO_2$ film 11. The polysilicon base electrodes 13 are formed to be contacted with the respective base regions 6 at their peripheries through the corresponding base windows 17 of the SiO2 film 11.

To reduce the resistance, boron (B) is selectively ion-implanted into the base electrodes 13 through the fourth $SiO_2$ film 12, and phosphorus (P) is selectively ion-implanted into the collector electrodes 10 through the fourth $SiO_2$ film 12. The base electrodes 13 and the collector electrodes 10 are subjected to a heat treatment at 900° C. for 30 minutes for annealing. During this heat treatment process, the arsenic atoms doped into the $n^+$-polysilicon sidewalls 8 diffuse laterally within the epitaxial layer 5 toward the centers of the islands I, resulting in the $n^+$-diffusion regions 9 surrounding the respective collector regions 5a.

Subsequently, the fourth $SiO_2$ film 12 is deposited on the third $SiO_2$ film 11 and the exposed islands over the entire substrate 1. The film 12 is then selectively etched to produce the emitter windows 18, as shown in FIG. 7I. The emitter windows 18 are located at the centers of the respective base regions 6.

A polysilicon film is deposited by a CVD process on the fourth $SiO_2$ film 12 over the entire substrate 1, and is patterned to form the emitter electrodes 14 over the respective base regions 6. The emitter electrodes 14 are contacted with the base respective regions 6 through the corresponding emitter windows 18 of the film 12, as shown in FIG. 5.

To reduce the resistance, arsenic it selectively ion-implanted into the emitter electrodes 14. The emitter electrodes 14 are subjected to a heat treatment at 900° to 950° C. for 10 to 20 minutes for annealing. During this heat treatment process, the arsenic atoms doped into the emitter electrodes 14 diffuse vertically into the base regions 6, resulting in the n-emitter regions 7 right below the respective emitter windows 18.

Thus, the semiconductor device shown in FIGS. 5 and 6 is obtained.

With the fabrication method of the semiconductor device according to the first embodiment, the semiconductor device of FIGS. 5 and 6 is fabricated by forming the islands I on the first $SiO_2$ film 2, forming the polysilicon sidewalls 8 to surround the corresponding islands I, and forming the collector electrodes 10 to be contacted with the corresponding sidewalls 8. Consequently, the semiconductor device of FIGS. 5 and 6 whose bipolar transistors each has the reduced collector area, reduced collector resistance and reduced collector-substrate capacitance can be more simply fabricated than the cases of the conventional semiconductor devices of FIGS. 1 to 4.

The simplicity of fabrication can realize a shortened necessary period of fabrication an increased fabrication yield.

Further, in the first embodiment, since the polysilicon sidewalls 8 are doped with arsenic having a relatively small diffusion coefficient, any problems such as a leakage current do not occur due to the lateral diffusion of the arsenic atoms from the sidewalls 8 within the epitaxial layer 5 in the islands I.

Popularly, phosphorus having a relatively greater diffusion coefficient is employed as a dopant in the similar cases to the sidewalls 8. However, arsenic is employed in the first embodiment and as a result, the above problems are ensured to be prevented from occurring.

In recent years, the high-speed bipolar transistor tends to have shallow p-n junctions. In consideration with this point, the semiconductor device of the first embodiment is advantageous to such the high-speed transistor because no heat treatment process at a relatively high temperature is required to form the emitter and base regions 6 and 7 and the shallow p-n junctions are readily obtained.

Second Embodiment

The semiconductor device according to a second embodiment is the same in structure as that of the first embodiment.

However, a fabrication method of the second embodiment is different from that of the first embodiment.

The method of the second embodiment is the same as that of the first embodiment except for the sidewall formation process. Specifically, after the islands I are produced on the first $SiO_2$ film 2 as shown in FIG. 7B, the $n^+$-polysilicon sidewalls 8 doped with arsenic are directly formed by selectively growing polysilicon films onto the outer sides of the respective islands I.

In the fabrication method of the second embodiment, since the process of forming the polysilicon film 8a as shown in FIG. 7C is not required, an additional advantage that the number of the necessary process steps decreases still more compared with the first embodiment is obtained.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device comprising:
   a semiconductor substrate;
   a first insulator film formed on said substrate;
   semiconductor islands formed on said first insulator film, each of said islands having an electronic component and being vertically isolated by said first insulator film;
   semiconductor sidewalls formed to surround respective ones of said islands from a bottom to a top of said respective islands, said sidewalls being contacted with outer sides of said respective islands;
   a second insulator film formed on exposed said first insulator film to laterally isolate said respective islands; and
   electrodes formed outside said islands to be contacted with respective ones of said sidewalls, tops of said electrodes being exposed from said second insulator film, and bottom portions of said electrodes being interior to said second insulator film and contacting said respective sidewalls,
   wherein said electronic components are electrically connected to respective ones of said electrodes through said respective sidewalls.

2. A device as claimed in claim 1, wherein each of said sidewalls is made of a polycrystalline semiconductor doped with arsenic.

3. A device as claimed in claim 1, wherein said electronic components provided in said islands are bipolar transistors, and said electrodes are used as collector electrodes of said transistors.

4. A semiconductor device comprising:
   a semiconductor substrate;
   a first insulator film formed on said substrate;
   semiconductor islands formed on said first insulator film, each of said islands having a bipolar transistor and being vertically isolated by said first insulator film;
   semiconductor sidewalls formed to surround respective ones of said islands from a bottom to a top of said respective islands, said sidewalls being contacted with outer sides of said respective islands;
   a second insulator film formed on exposed said first insulator film to laterally isolate said respective islands; and
   collector electrodes formed outside said islands to be contacted with respective ones of said sidewalls, tops of said collector electrodes being exposed from said second insulator film, and bottom portions of said collector electrodes being interior to said second insulator film and contacting said respective sidewalls,
   wherein collector regions of said transistors are electrically connected to respective ones of said collector electrodes through said respective sidewalls.

5. A device as claimed in claim 4, wherein each of said sidewalls is made of a polycrystalline semiconductor doped with arsenic.

6. A semiconductor device comprising:
   a semiconductor substrate;
   a first insulator film formed on said substrate;
   single-crystal silicon islands formed on said first insulator film, each of said islands having a bipolar transistor and being vertically isolated by said first insulator film;
   each of said bipolar transistors having a semiconductor buried layer formed at a bottom of said island, a collector region formed on said buried layer, a base region formed on said collector region, and an emitter region formed in said base region;
   polysilicon sidewalls formed on said first insulator film to surround respective ones of said islands from a bottom to a top part of said respective islands, said sidewalls being contacted with outer sides of said respective islands;
   base electrodes formed to be contacted with respective ones of said base regions;
   emitter electrodes formed to be contacted with respective ones of said emitter regions; and
   a second insulator film formed on exposed said first insulator film to laterally isolate said respective islands;
   collector electrodes formed outside said islands to be contacted with respective ones of said sidewalls tops of said collector electrodes being exposed from said second insulator film, and bottom portions of said collector electrodes being interior to said second insulator film and contacting said respective sidewalls;
   a third insulator film formed on said islands and said second insulator film, said third insulator film having a collector window and a base window;
   a fourth insulator film formed on said third insulator film, said fourth insulator film having an emitter window; and
   said collector electrode being contacted with said collector region through said collector window, said base electrode being contacted with said base region through said base window, and said emitter electrode being contacted with said emitter region through said emitter window;
   wherein said buried layers of said transistors are electrically connected to respective ones of said collector electrodes through said respective sidewalls.

7. A device as claimed in claim 6, wherein said sidewalls are doped with arsenic.

8. A fabrication method of a semiconductor device comprising the steps of:
   (a) preparing a semiconductor substructure made of a semiconductor substrate, a first insulator film formed on said substrate, and a first semiconductor layer formed on said first insulator film;
   (b) doping an impurity of one conductivity type into said first semiconductor layer of said substructure;
   (c) expitaxially growing a second semiconductor layer of said conductivity type on said first semiconductor layer;

(d) selectively removing said first semiconductor layer and said second semiconductor layer to produce semiconductor islands on said first insulator film, said island being vertically isolated by said first insulator film;

(e) forming semiconductor sidewalls to surround respective ones of said islands from a bottom to a top of said respective islands, said sidewalls being contacted with outer sides of said respective islands;

(g) forming a second insulator film on said exposed first insulator film from said islands to laterally isolate said respective islands;

(h) forming electrodes outside said islands to be contacted with respective ones of said sidewalls, tops of said electrodes being formed to be exposed from said second insulator film, and bottom portions of said electrodes being formed to be interior to said second insulator film and contacting said respective sidewalls; and (i) forming electronic components in said respective islands;

wherein said electronic components are electrically connected to respective ones of said electrodes through said respective sidewalls.

9. A method as claimed in claim 8, wherein each of said sidewalls is made of a polycrystalline semiconductor doped with arsenic.

10. A method as claimed in claim 8, wherein, said electronic components provided in said islands are bipolar transistors, and said electrodes are used as collector electrodes of said transistors.

11. A fabrication method of a semiconductor device comprising the steps of:

(a) preparing a semiconductor substructure made of a semiconductor substrate, a first insulator film formed on said substrate, and a first single-crystal silicon layer formed on said first insulator film;

(b) doping an impurity of one conductivity type into said first silicon layer of said substructure;

(c) expitaxially growing a second single-crystal silicon layer of said conductivity type on said first silicon layer;

(d) selectively removing said first silicon layer and said second silicon layer to produce single-crystal silicon islands on said first insulator film, said islands being vertically isolated by said first insulator film;

(e) forming polysilicon sidewalls to surround respective ones of said islands from a bottom to a top of said respective islands, said sidewalls being contacted with outer sides of said respective islands;

(g) forming a second insulator film on said exposed first insulator film from said islands to laterally isolate said respective islands;

(h) forming a third insulator film having collector windows and base windows on said islands and said second insulator film;

(i) forming base regions in said second silicon layer in said respective islands, said remaining second silicon layers acting as collector regions;

(j) forming collector electrodes outside said islands to be contacted with respective ones of said sidewalls through respective ones of said collector windows of said third insulator film, tops of said collector electrodes being formed to be exposed from said second insulator film, and bottom portions of said collector electrodes being formed to be interior to said second insulator film and contacting said respective sidewalls;

(k) forming base electrodes to be contacted with respective ones of said base regions through respective ones of said base windows of said third insulator film;

(l) forming a fourth insulator film having emitter windows on said third insulator film;

(m) forming emitter regions in said second silicon layer in said respective islands through respective ones of said emitter windows of said fourth insulator film; and (n) forming emitter electrodes to be contacted with respective ones of said emitter regions through said respective emitter windows of said fourth insulator film;

wherein said first silicon layer and said second silicon layer in said islands are electrically connected to respective ones of said collector electrodes through said respective sidewalls.

12. A method as claimed in claim 11, wherein each of said polysilicon sidewalls is doped with arsenic.

13. A semiconductor device comprising:

a semiconductor substrate with a first insulator film thereatop;

a semiconductor island on said first insulator film which is surrounded by a sidewall which extends from said first insulator film to a top of said island, said island being adapted to have an electronic component formed therein;

a second insulator film surrounding an exterior of said sidewall which extends from said first insulator film to a top of said sidewall; and an electrode in said second insulator film which contacts said sidewall and which is adapted to provide electrical contact to an electronic component in said island through said sidewall.

14. The semiconductor device of claim 13 further comprising a diffused region in a periphery of said island which contacts said sidewall for facilitating electrical contact with an electrical component in said island through said sidewall.

* * * * *